United States Patent
Sung et al.

(10) Patent No.: US 11,551,072 B2
(45) Date of Patent: Jan. 10, 2023

(54) SPIKING NEURAL NETWORKS CIRCUIT AND OPERATION METHOD THEREOF

(71) Applicant: MACRONIX INTERNATIONAL CO., LTD., Hsinchu (TW)

(72) Inventors: Cheng-Lin Sung, Taichung (TW); Teng-Hao Yeh, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 332 days.

(21) Appl. No.: 16/872,404

(22) Filed: May 12, 2020

(65) Prior Publication Data

US 2021/0241081 A1    Aug. 5, 2021

Related U.S. Application Data

(60) Provisional application No. 62/970,153, filed on Feb. 4, 2020.

(51) Int. Cl.
| | |
|---|---|
| *G06N 3/063* | (2006.01) |
| *G11C 11/54* | (2006.01) |
| *G06N 3/04* | (2006.01) |
| *G11C 16/26* | (2006.01) |
| *G11C 16/24* | (2006.01) |

(52) U.S. Cl.
CPC ............. *G06N 3/063* (2013.01); *G06N 3/049* (2013.01); *G11C 11/54* (2013.01); *G11C 16/24* (2013.01); *G11C 16/26* (2013.01)

(58) Field of Classification Search
CPC ........ G06N 3/063; G06N 3/049; G11C 16/08; G11C 16/10; G11C 16/16
See application file for complete search history.

(56) References Cited

U.S. PATENT DOCUMENTS

| | | | |
|---|---|---|---|
| 10,353,618 B2 | 7/2019 | Lea et al. | |
| 10,482,929 B2 * | 11/2019 | Li | G11C 5/02 |
| 10,522,226 B2 | 12/2019 | Tran et al. | |
| 11,264,084 B2 * | 3/2022 | Kim | G11C 11/4087 |
| 2019/0243651 A1 | 8/2019 | Venkataramani et al. | |
| 2019/0286976 A1 * | 9/2019 | Tran | G11C 16/24 |
| 2020/0026991 A1 | 1/2020 | Lin et al. | |
| 2020/0410040 A1 * | 12/2020 | Lee | G06G 7/16 |

FOREIGN PATENT DOCUMENTS

| | | |
|---|---|---|
| CN | 108701473 A | 10/2018 |
| TW | 201946064 A | 12/2019 |
| TW | 201946066 A | 12/2019 |
| TW | 202006609 A | 2/2020 |

* cited by examiner

*Primary Examiner* — Ajay Ojha
(74) *Attorney, Agent, or Firm* — McClure, Qualey & Rodack, LLP

(57) ABSTRACT

A spiking neural networks circuit and an operation method thereof are provided. The spiking neural networks circuit includes a bit-line input synapse array and a neuron circuit. The bit-line input synapse array includes a plurality of page buffers, a plurality of bit line transistors, a plurality of bit lines, a plurality of memory cells, one word line, a plurality of source lines and a plurality of source line transistors. The page buffers provides a plurality of data signals. Each of the bit line transistors is electrically connected to one of the page buffers. Each of the bit lines receives one of the data signals. The source line transistors are connected together. The neuron circuit is for outputting a feedback pulse.

20 Claims, 15 Drawing Sheets

SPIKING NEURAL NETWORKS CIRCUIT AND OPERATION METHOD THEREOF

This application claims the benefit of U.S. provisional application Ser. No. 62/970,153, filed Feb. 4, 2020, the subject matter of which is incorporated herein by reference.

BACKGROUND OF THE INVENTION

Field of the Invention

The invention relates in general to a circuit and an operation method thereof, and more particularly to a spiking neural networks circuit and an operation method thereof.

Description of the Related Art

With the prosperous growth of artificial intelligence, the emerging architectures of edge computing, providing privacy preserving, powerful computing, and low energy consumption, have attracted strong business attention due to their application in diverse fields.

Taking advantages of training and inference on local memory devices that thoroughly diminishes the energy consumption of data movement for von Neumann architectures, spiking neural networks (SNN) have been considered as one of the promising candidate for edge computing. While the energy efficiency are conceptually improved using architectures of spiking neural networks, the power consumption on the operation of memory array is still a number that cannot be ignored.

SUMMARY OF THE INVENTION

The invention is directed to a spiking neural networks circuit and an operation method thereof. The spiking neural networks circuit is inputted data signals through the bit lines. The bit-line input scheme not only reduces more energy consumption than word-line input scheme but significantly increases the area efficiency of memory array.

According to a first aspect of the present invention, a spiking neural networks (SNN) circuit is provided. The spiking neural networks circuit includes a bit-line input synapse array and a neuron circuit. The bit-line input synapse array includes a plurality of page buffers, a plurality of bit line transistors, a plurality of bit lines, a plurality of memory cells, one word line, a plurality of source lines and a plurality of source line transistors. The page buffers provide a plurality of data signals. Each of the bit line transistors is electrically connected to one of the page buffers. Each of the bit lines is electrically connected to one of the bit line transistor for receiving one of the data signals. Each of the memory cells is electrically connected to one of the bit lines. The word line is electrically connected to the memory cells. Each of the source lines is electrically connected to one of the memory cells. Each of the plurality of source line transistors is electrically connected to one of the source lines. The source line transistors are connected together. The neuron circuit is for outputting a feedback pulse.

According to a second aspect of the present invention, an operation method of a spiking neural networks (SNN) circuit is provided. The spiking neural networks circuit includes a bit-line input synapse array and a neuron circuit. The bit-line input synapse array includes a plurality of bit lines, a plurality of memory cells, one word line and a plurality of source lines. Each of the memory cells is electrically connected to one of the bit lines. The word line is electrically connected to the memory cells. Each of the source lines is electrically connected to one of the memory cells. The operation method includes the following steps. A plurality of data signals are inputted to the bit lines during a read phase. Currents reflecting the data signals are collected by the source lines during the read phase.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
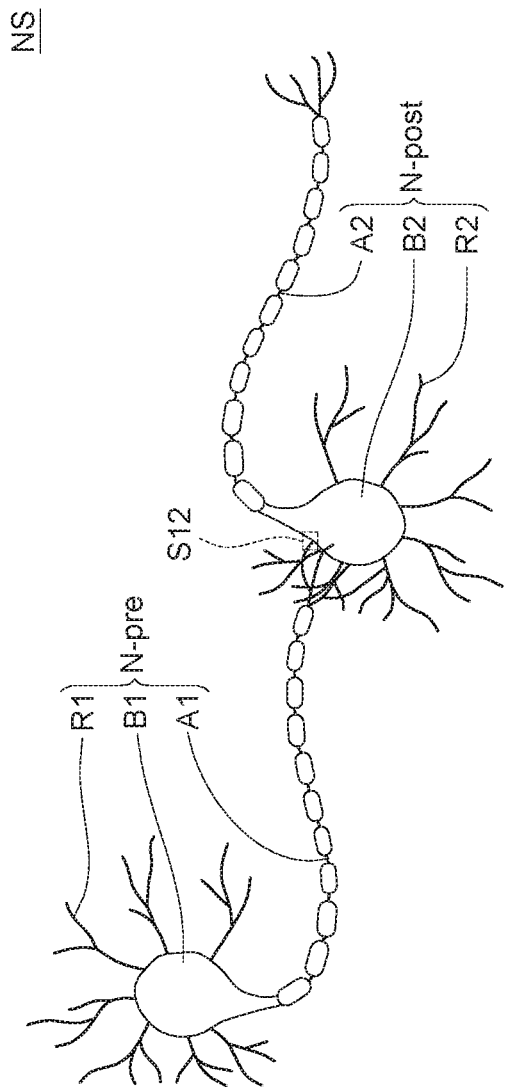
FIG. 1 shows a concept of a neural system.

Please refer to FIG. 1, which shows a concept of a neural system NS. A presynaptic cell N_pre includes a cell body B1, a plurality of dendrites R1 and an axon A1. A postsynaptic cell N_post includes a cell body B2, a plurality of dendrites R2 and an axon A2. Signal is outputted from the axon A1 to the dendrites R2. The connection between the axon A1 and the dendrites R2 is a synapse S12.

Figure 2:
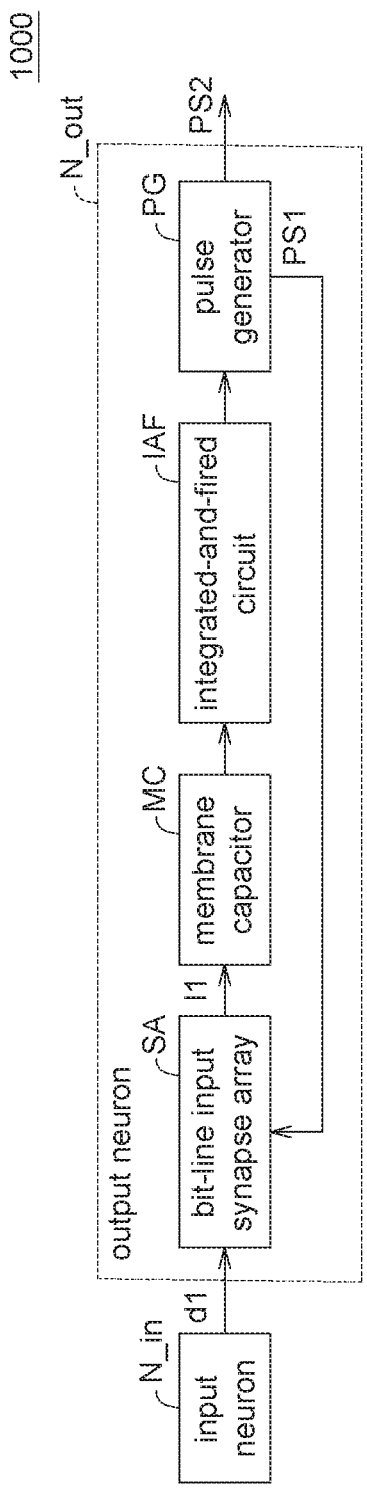
FIG. 2 shows a concept of a spiking neural networks (SNN) circuit.

Please refer to FIG. 2, which shows a concept of a spiking neural networks (SNN) circuit 1000. The spiking neural networks circuit 1000 can be used for Neuromorphic computing. Similar to the presynaptic cell N_pre and the postsynaptic cell N_post of the neural system NS, an input neuron N_in transmits data signals d1 to an output neuron N_out. The data signals d1 are inputted into a bit-line input synapse array SA and currents I1 reflecting the data signals d1 are accumulated in a membrane capacitor MC. When a potential of the membrane capacitor MC exceeds a threshold, an integrated-and-fired circuit IAF triggers a pulse generator PG to generate a feedback pulse PS1 or an output pulse PS2.

Figure 3:
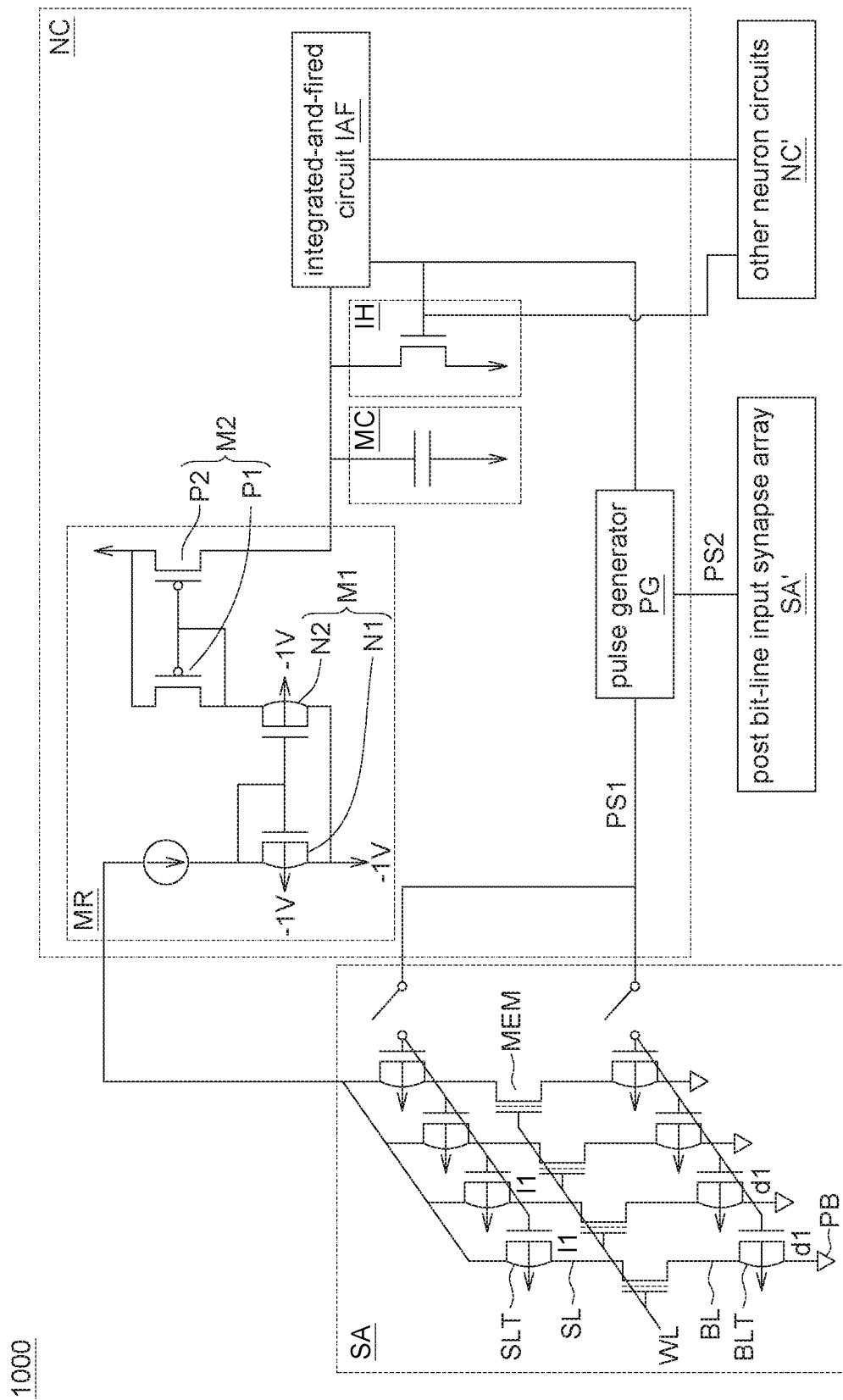
FIG. 3 shows a circuit diagram of the spiking neural networks circuit.

Please referring to FIG. 3 which shows a circuit diagram of the spiking neural networks circuit 1000. The bit-line input synapse array SA includes a plurality of page buffers PB, a plurality of bit line transistors BLT, a plurality of bit lines BL, a plurality of memory cells MEM, one word line WL, a plurality of source lines SL, and a plurality of source line transistors SLT. The page buffers PB provide a plurality of data signals d1. Each of the bit line transistors BLT is electrically connected to one of the page buffers PB. For example, the bit line transistors BTL are triple well devices. Each of the bit lines BL is electrically connected to one of the bit line transistors BLT for receiving one of the data signals d1. Each of the memory cells MEM is electrically connected to one of the bit lines BL. The only one word line WL is electrically connected to the memory cells MEM. Each of the source lines SL is electrically connected to one of the memory cells MEM. Each of the source line transistors SLT is electrically connected to one of the source lines SL. For example, the source line transistors SLT are triple well devices. The source line transistors SLT are connected together to collect the currents I1 reflecting the data signals d1.

The neuron circuit NC includes a current mirror circuit MR, the membrane capacitor MC, an inhibitory field-effect transistor (FET) IH, the integrated-and-fired circuit IAF and the pulse generator PG. The current mirror circuit MR is electrically connected to the bit-line input synapse array SA. The currents I1 is copied by the current mirror circuit MR. The membrane capacitor MC is electrically connected to the current mirror circuit MR for receiving and accumulating the currents I1. The integrated-and-fired circuit IAF is electrically connected to the membrane capacitor MC and the inhibitory field-effect transistor IH. The pulse generator PG is electrically connected to the integrated-and-fired circuit IAF, the bit line transistors BLT and the source line transistors SLT.

When the potential of the membrane capacitor MC exceeds the threshold, the integrated-and-fired circuit IAF triggers the pulse generator PG to generate the feedback pulse PS1 or triggers the pulse generator PG to generate the output pulse PS2 to post bit-line input synapse array SA', and the inhibitory field-effect transistor IH suppresses an firing action of other neuron circuits NC'.

Further, the current mirror circuit MR includes a first current mirror M1 and a second current mirror M2. The first current mirror M1 includes two N type Metal-Oxide-Semiconductor (NMOS) transistors N1, N2. For example, the NMOS transistors N1, N2 are triple well devices. The second current mirror M2 is connected to the first current mirror M1. The second current mirror M2 includes two P type Metal-Oxide-Semiconductor (PMOS) transistors P1, P2. The second current mirror M2 is an inverse current mirror which is designed for the bit line input scheme.

In one embodiment, the current mirror circuit MR may include cascade current mirrors for minimizing the size of the membrane capacitor MC.

Figure 4:
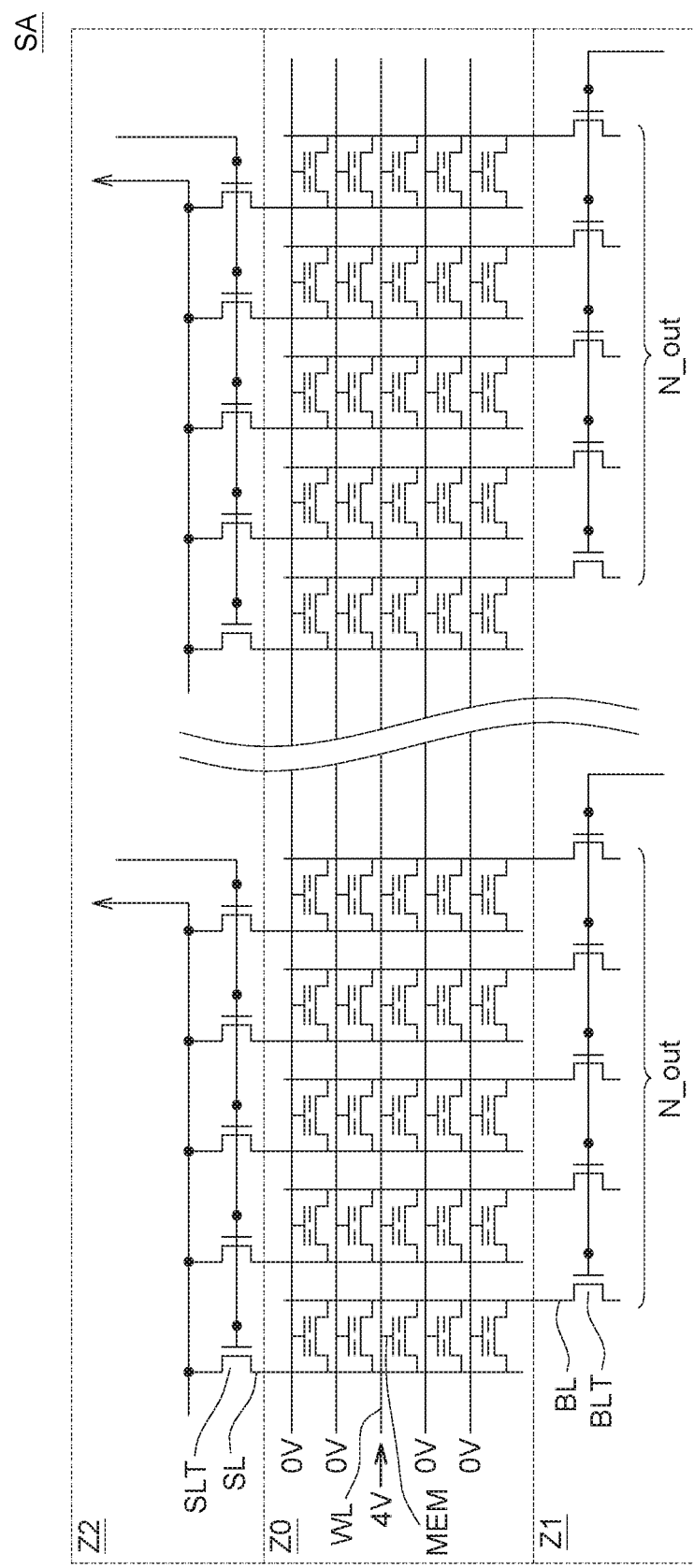
FIG. 4 illustrates the scheme of the bit-line input synapse array.

Please refer to FIG. 4, which illustrates the scheme of the bit-line input synapse array SA. The bit line transistors BLT and the bit lines BL form a presynaptic zone Z1, the memory cells MEM and the word line WL form a synaptic zone Z0, and the source line transistors SLT and the source lines SL form a postsynaptic zone Z2. A dataset is saved in one word line WL where 4V is applied. That is to say, the memory cells MEM storing weights corresponding to this dataset are connected to the only one word line WL. This is called word line direction (1-dimensional) data storage. Other data sets can be saved in other word lines WL. The area efficiency of memory array is significantly increased.

Figure 5:
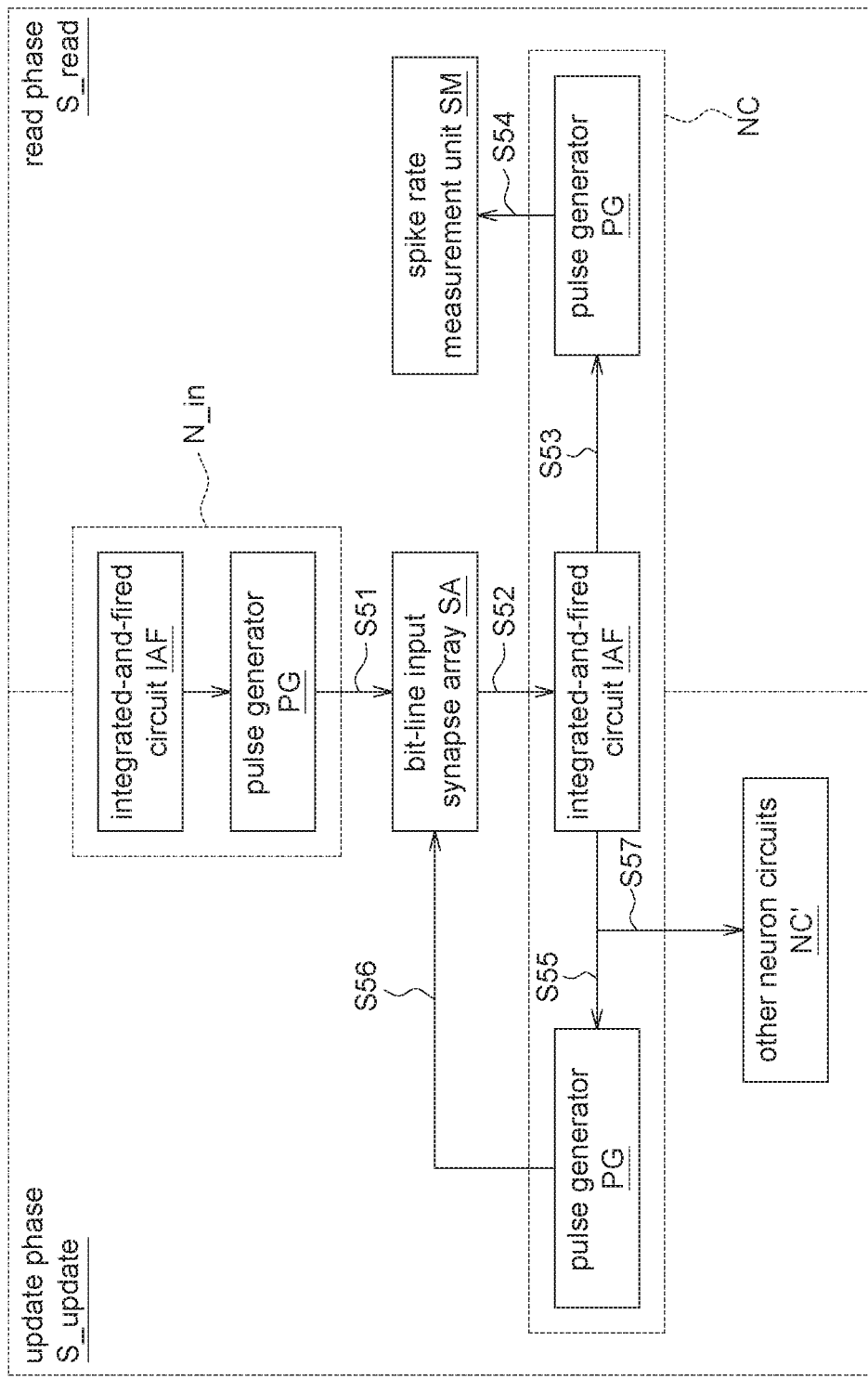
FIG. 5 illustrates an operation flow of the spiking neural networks circuit.

Please refer to FIG. 5, which illustrates an operation flow of the spiking neural networks circuit 1000. The operation flow includes a read phase S_read and an update phase S_update. The read phase S_read includes steps S51 to S54.

In the step S51, the data signals d1 are inputted from the input neuron N_in to the bit-line input synapse array SA. Then, in the step S52, the currents I1 reflecting the data signals d1 are accumulated. Next, in the step S53, the integrated-and-fired circuit IAF fires a spike to the pulse generator PG. In the step S54, after receiving the spike, the pulse generator PG generates the output pulse PS2 to a spike rate measurement unit SM.

The update phase S_update includes steps S51, S52, S55, S56 and S57. In the step S55, the integrated-and-fired circuit IAF fires a spike to the pulse generator PG. In the step S56, after receiving the spike, the pulse generator PG generates the feedback pulse PS1 to the bit-line input synapse array SA for turning on the bit line transistors BLT. In the step S57, the integrated-and-fired circuit IAF fires an inhibitory signal to other neuron circuit NC' to suppress the firing action of other neuron circuits NC' which are losers.

Figure 6:
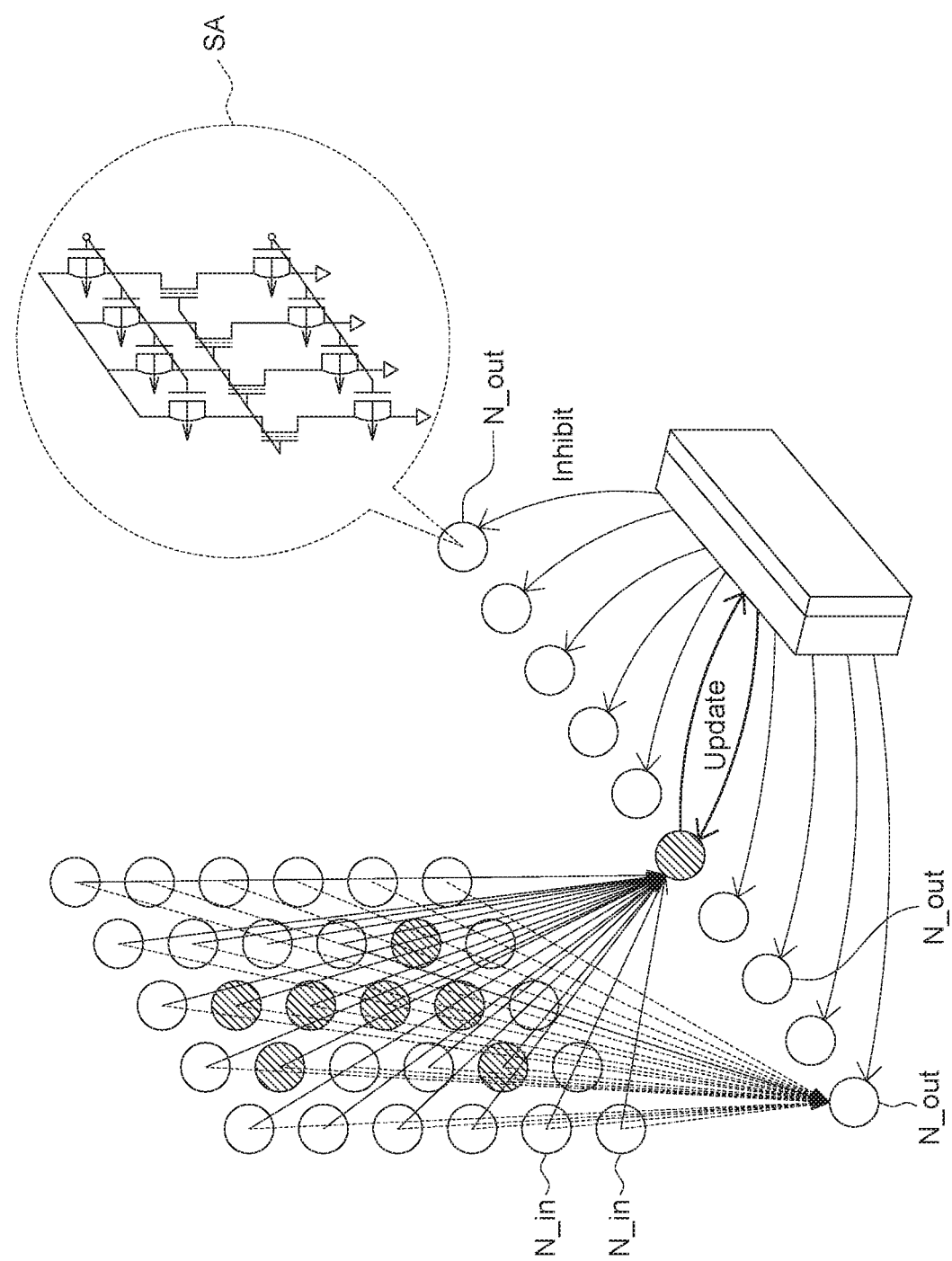
FIG. 6 illustrates the Winner-Take-All operation.

In the present embodiment, the update phase S_update follows a Winner-Take-All (WTA) operation. Please refer to FIG. 6, which illustrates the Winner-Take-All operation. Only one of the output neurons N_out which has the most similar states to the input neurons N_in will win the update chance to change its internal states and enhance the connection with the data signals d1. Additionally, the winner will inhibit the connection between the input neurons N_in and other output neurons N_out. The Winner-Take-All behaviors eventually lead each output neurons N_out to learn different features.

Figure 7:
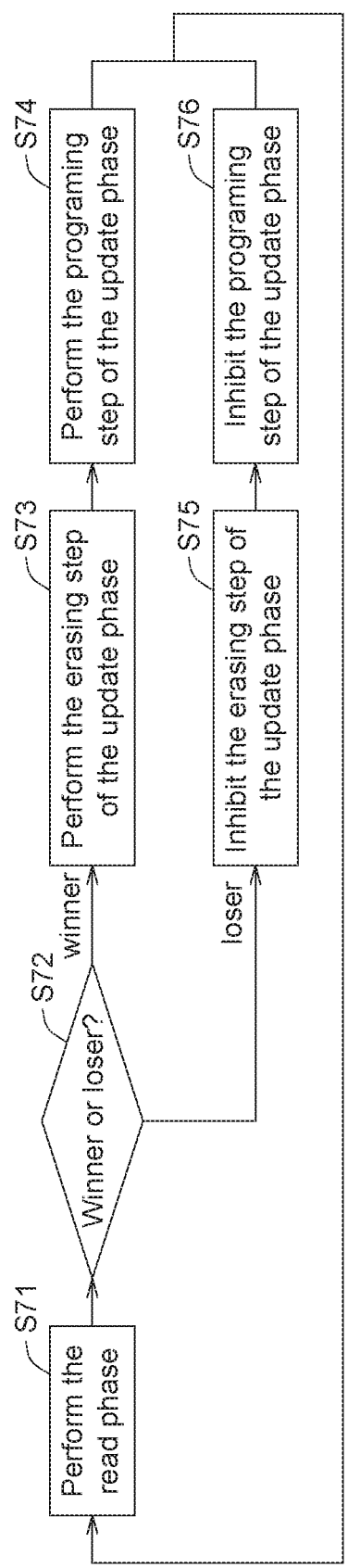
FIG. 7 shows an operation flow of the bit-line input synapse array.

According to the Winner-Take-All operation, the winner and the loser(s) perform different actions during the update phase S_update. Please refer to FIG. 7 to FIG. 8E. FIG. 7 shows an operation flow of the bit-line input synapse array SA. FIGS. 8A to 8E illustrate the steps in FIG. 7.

Figure 8A:
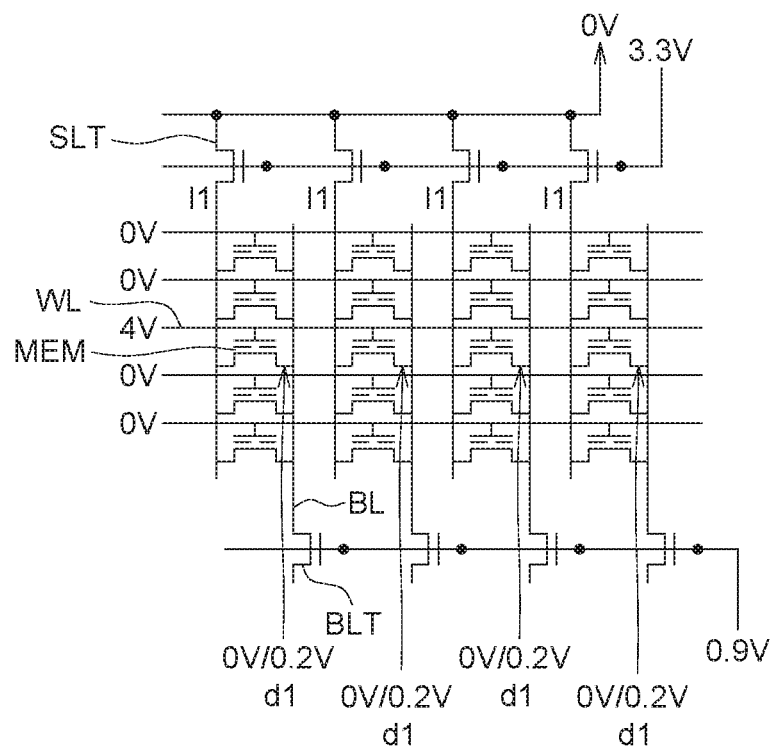
FIGS. 8A to 8E illustrate the steps in FIG. 7.

In step S71, the read phase S_read is performed for reading the data signals d1. Referring to FIG. 8A, during the read phase S_read, the word line WL is applied 4V. The gates of the bit line transistors BLT are applied 0.9V. The data signals d1 are inputted to the bit line BL. Each of the data signals d1 is a pattern signal or a background signal. The pattern signal is a 0.2V signal. The background signal is a 0V signal. Some of the memory cells MEM are erased and some of the memory cells MEM are programed, such that weights are recorded in the memory cells MEM to represent the feature to be identified. The currents I1 passing through those memory cells MEM will reflected by the data signals d1. For example, if the data signal d1 is the 0.2V signal and the memory cell MEM has been erased, the current I1 will be high; if the data signal d1 is the 0V signal and the memory cell MEM has been erased, the current I1 will be low.

The source line transistors SLT are applied 3.3V to turn on the source line transistors SLT, so the currents I1 reflecting the data signals d1 can be collected. The currents I1 are accumulated in the membrane capacitor MC (shown in FIG. 3). If the data signals d1 are similar to the features to be identified, the potential of the membrane capacitor MC will quickly exceed the threshold and this output neuron N_out is the winner. Others of the output neurons N_out are the losers.

Next, in the step S72, whether this output neuron N_out is a winner or a loser is determined. If this output neuron N_out is a winner, the process proceeds to steps S73 and S74 for performing the update phase S_update; if this output neuron N_out is a loser, the process proceeds to steps S75 and S76 for inhibiting the update phase S_update. That is to say, the winner and the loser(s) perform different actions during the update phase S_update.

Figure 8B:
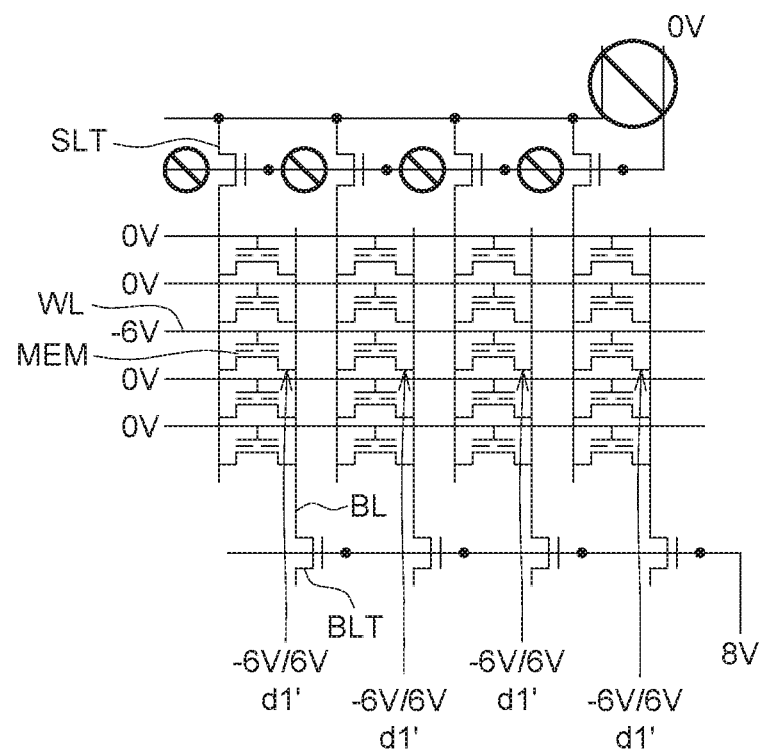

In the step S73, an erasing step S_ers of the update phase S_update is performed. Referring to FIG. 8B, during the erasing step S_ers of the update phase S_update, the word line WL is applied −6V. The gates of the bit line transistors BLT are applied 8V to turn on the bit line transistors BLT. The gates of the source line transistors SLT are applied 0V to turn off the source line transistors SLT and keep the source lines SL being floating. Shifted data signals d1' are inputted to the bit line BL. Each of the shifted data signals d1' is a shifted pattern signal or a shifted background signal. The shifted pattern signal is a 6V signal which is shifted with respect to the 0.2V signal. The shifted background signal is a −6V signal which is shifted with respect to the 0V signal. The voltage difference between the word line WL and the shifted data signals d1' which are the shifted pattern signal is −12V, so the memory cells where the shifted pattern signals pass through will be erased. The voltage difference between the word line WL and the shifted data signals d1' which are the shifted background signals is 0V, so the memory cells where the shifted background signals pass through will not be erased.

Figure 8C:
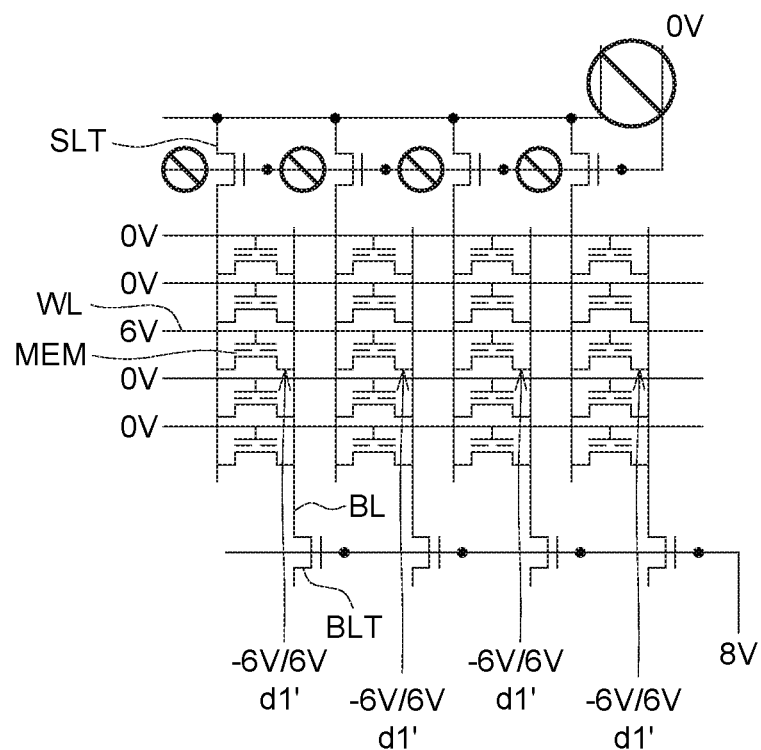

In the step S74, a programming step S_pgm of the update phase S_update is performed. Referring to FIG. 8C, during the programming step S_pgm of the update phase S_update, the word line WL is applied 6V. The gates of the bit line transistors BLT are applied 8V to turn on the bit line transistors BLT. The gates of the source line transistors SLT are applied 0V to turn off the source line transistors SLT and keep the source lines SL being floating. The shifted data signals d1' are inputted to the bit line BL. Each of the shifted data signals d1' is the shifted pattern signal or the shifted background signal. The shifted pattern signal is the 6V signal which is shifted with respect to the 0.2V signal. The shifted background signal is the −6V signal which is shifted with respect to the 0V signal. The voltage difference between the word line WL and the shifted data signals d1' which is the shifted pattern signal is 0V, so the memory cells where the shifted pattern signals pass through will be not be programed. The voltage difference between the word line WL and the shifted data signals d1' which is the shifted background signal is 12V, so the memory cells where the shifted background signals pass through will be programed.

Base on the steps S73 and S74 for the winner, the memory cells MEM where the shifted pattern signals (6V signals) pass through will be erased, and the memory cells MEM where the shifted background signals (−6V signals) pass through will be programed.

Figure 8D:
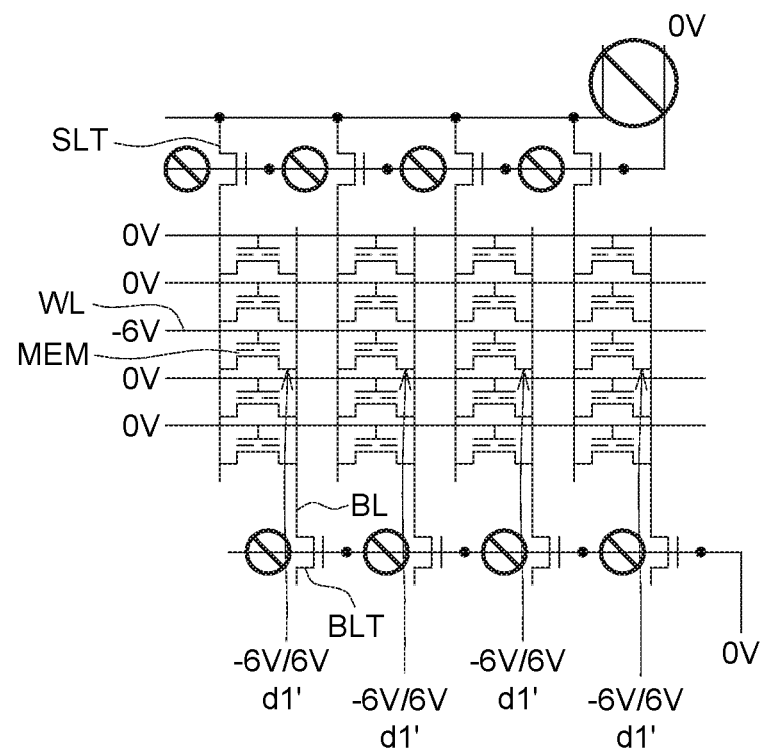

In the step S75, the erasing step S_ers of the update phase S_update is inhibited. Referring to FIG. 8D, during the erasing step S_ers of the update phase S_update, the word line WL is applied −6V. The gates of the bit line transistors BLT are applied 0V to turn off the bit line transistors BLT. The gates of the source line transistors SLT are applied 0V to turn off the source line transistors SLT and keep the source lines SL being floating. The shifted data signals d1' are inputted to the bit line BL. Because the bit line transistors BLT are turned off, the bit lines BL are blocked and the memory cells MEM cannot be erased.

Figure 8E:
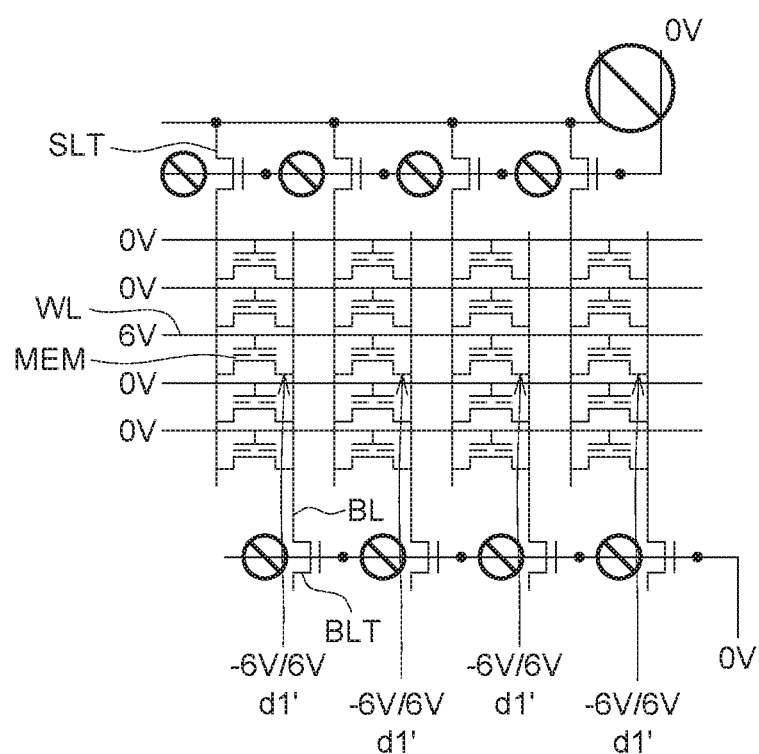

In the step S76, the programming step S_pgm of the update phase S_update is inhibited. Referring to FIG. 8E, during the programming step S_pgm of the update phase S_update, the word line WL is applied 6V. The gates of the bit line transistors BLT are applied 0V to turn off the bit line transistors BLT. The gates of the source line transistors SLT are applied 0V to turn off the source line transistors SLT and keep the source lines SL being floating. The shifted data signals d1' are inputted to the bit line BL. Because the bit line transistors BLT are turned off, the bit lines BL are blocked and the memory cells MEM cannot be programed.

Base on the steps S75 and S76 for the loser(s), the memory cells MEM will not be erased or programed.

Figure 9A:
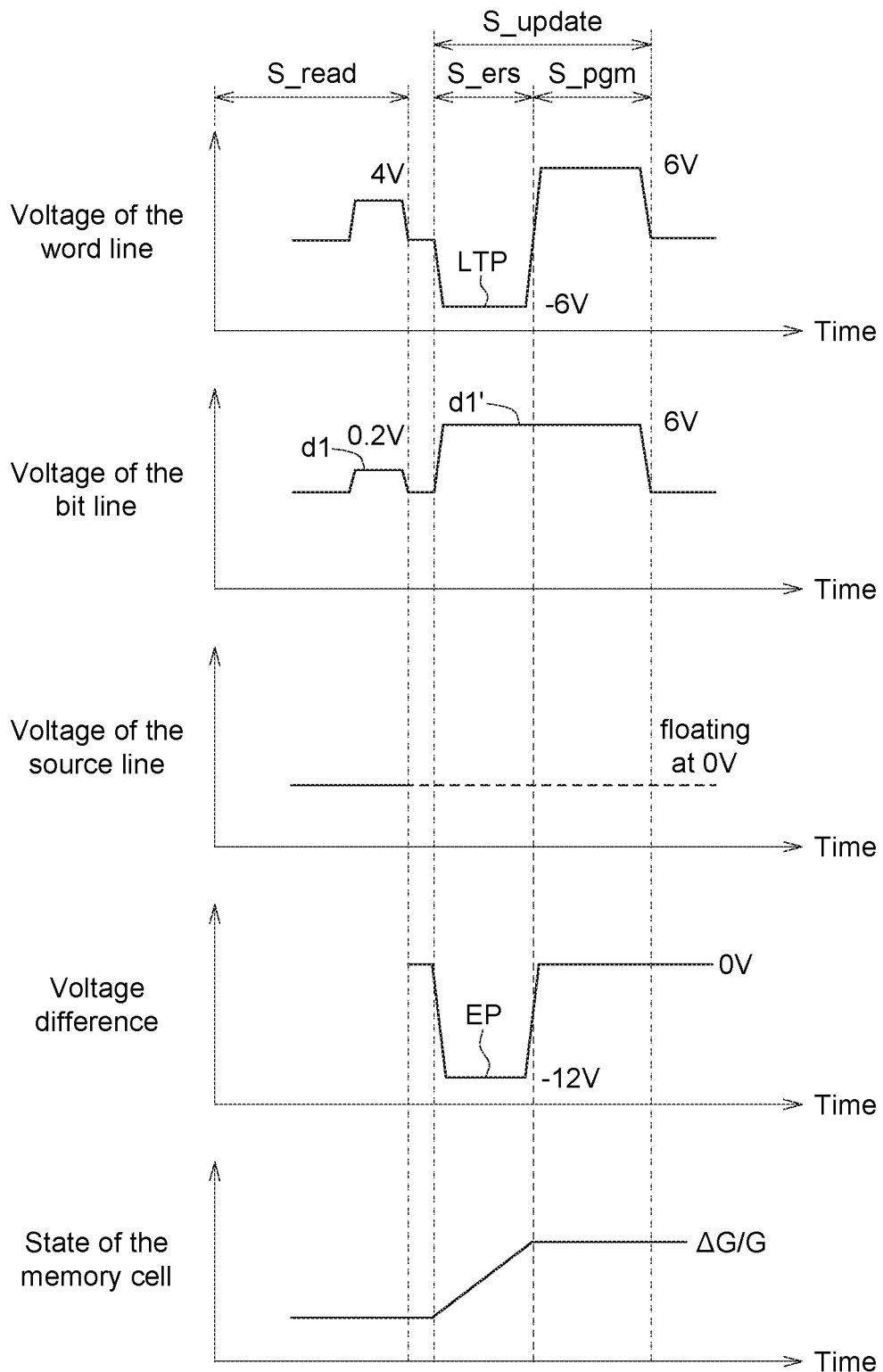
FIG. 9A illustrates the operation condition for the winner with the pattern signal.

Please refer to FIG. 9A which illustrates the operation condition for the winner with the pattern signal. During the read phase S_read, the data signal d1 (0.2V signal) which is the pattern signal is inputted to the bit lines BL, the word line WL is applied 4V, and the source line SL is applied 0V. Therefore, the currents I1 (shown in FIG. 3) reflecting the data signals d1 can be collected by the source lines SL during the read phase S_read.

During the update phase S_update, the shifted data signals d1' (6V signal) are inputted to the bit lines BL. A long-term potentiation signal LTP (−6V signal) is applied to the word line WL during the erasing step S_ers of the update phase S_update, and the source lines SL is floating. Therefore, an erasing pulse EP (−12V signal) is formed between the word line WL and the bit lines BL and the memory cell MEM is erased accordingly.

Figure 9B:
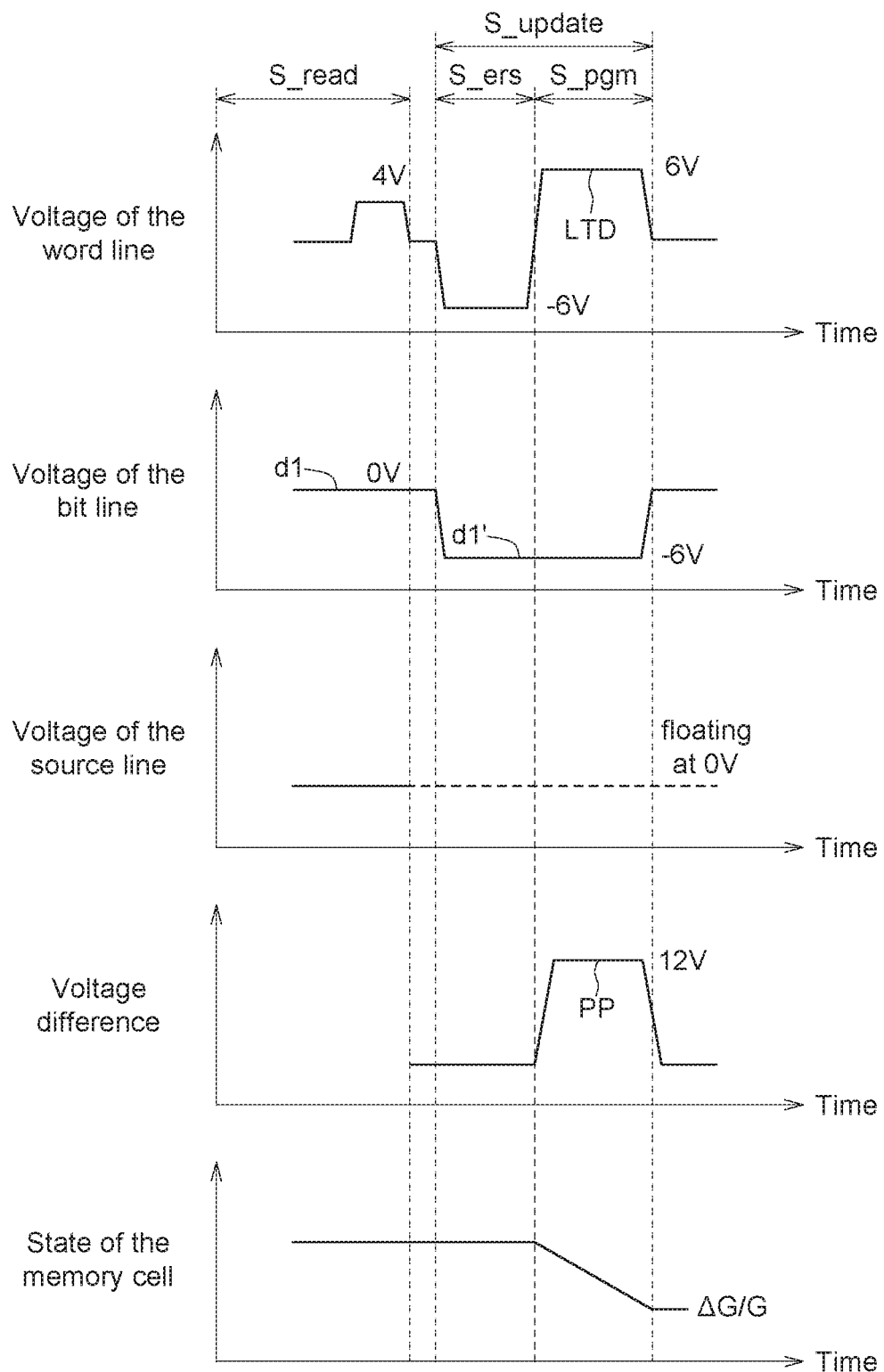
FIG. 9B illustrates the operation condition for the winner with the background signal.

Please referring to FIG. 9B, which illustrates the operation condition for the winner with the background signal. During the read phase S_read, the data signal d1 (0V signal) which is the background signal is inputted to the bit lines BL, the word line WL is applied 4V, and the source line SL is applied 0V. Therefore, the currents I1 (shown in FIG. 3) reflecting the data signals d1 can be collected by the source lines SL during the read phase S_read.

During the update phase S_update, the shifted data signals d1' (−6V signal) are inputted to the bit lines BL. A long-term depression signal LTD (6V signal) is applied to the word line WL during the erasing step S_pgm of the update phase S_update, and the source lines SL is floating. Therefore, a programming pulse PP (12V signal) is formed between the word line WL and the bit lines BL and the memory cell MEM is programed accordingly.

As shown in the FIGS. 9A to 9B, the memory cells MEM where the shifted pattern signals (6V signal) pass through will be erased, and the memory cells MEM where the shifted background signals (−6V signal) pass through will be programed.

Figure 10A:
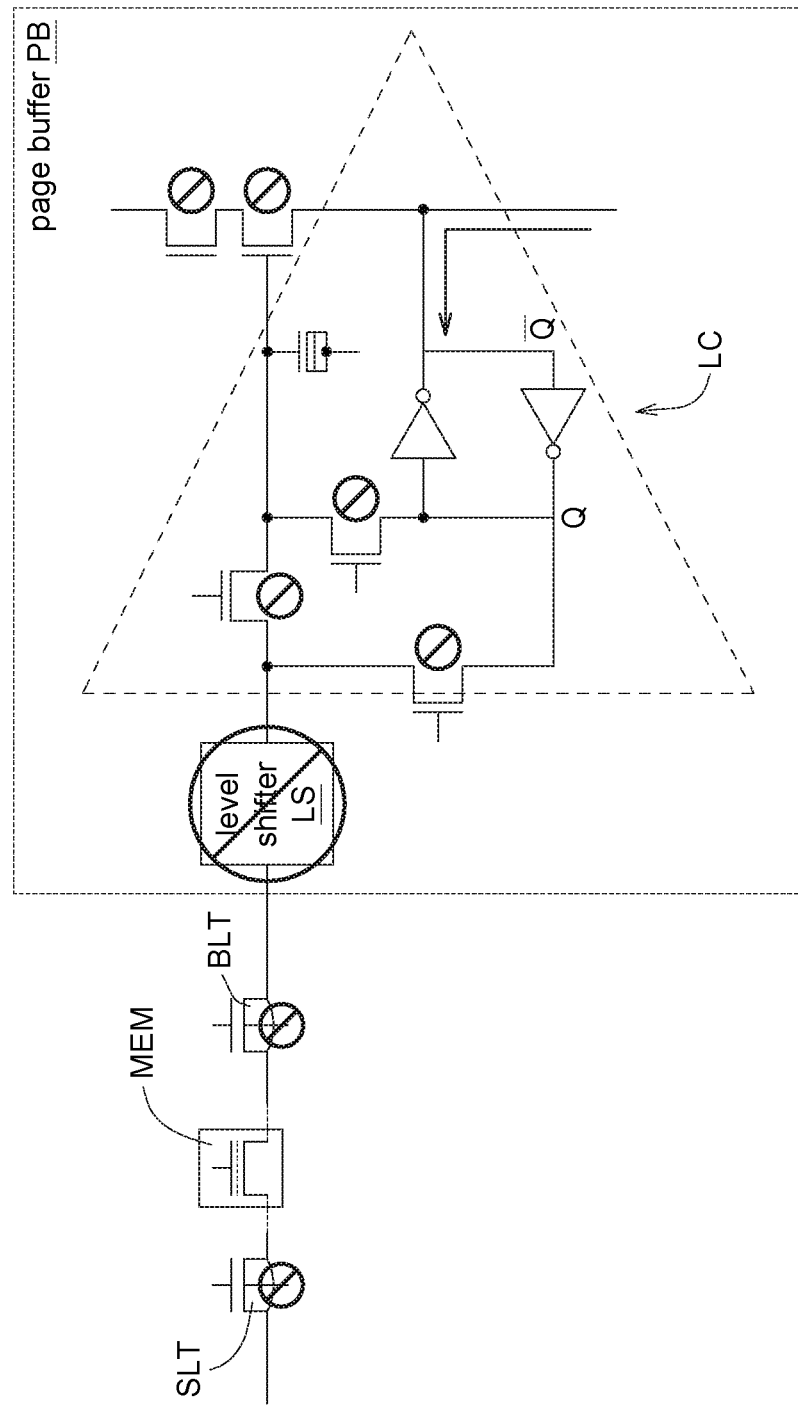
FIG. 10A illustrates an input phase of the page buffer.

Please refer to FIG. 10A, which illustrates an input phase of the page buffer PB. Refer FIG. 10A, the page buffer PB includes a latch LC and a level shifter LS. During the input phase, the data signal d1 are delivered from an input/output device and stored at the latch LC as Q and $\overline{Q}$. Q is 1.8V when the pattern signal is received; Q is 0V when the background signal is received.

Figure 10B:
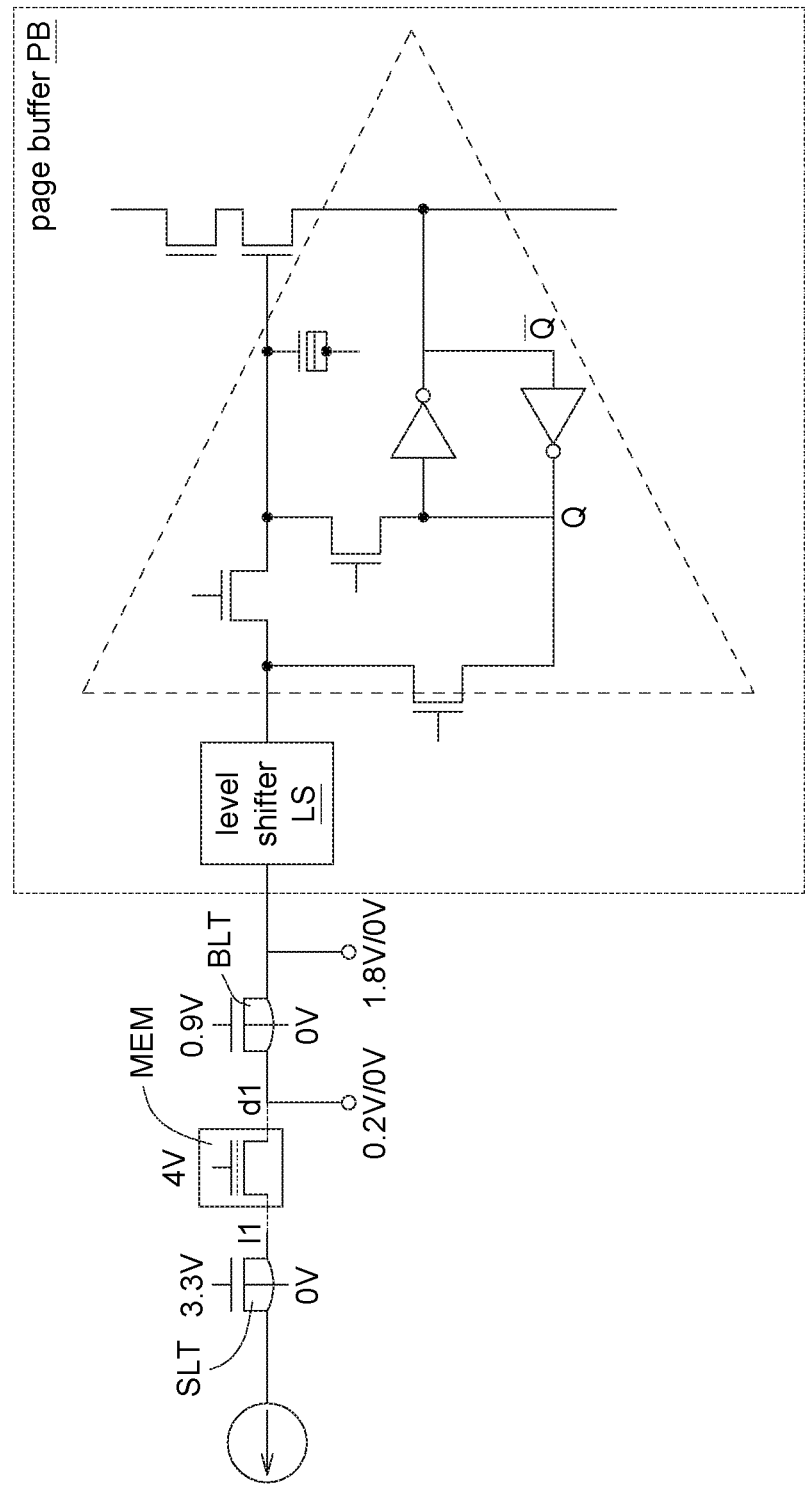
FIG. 10B illustrates the read phase of the page buffer.

Please refer to FIG. 10B, which illustrates the read phase S_read of the page buffer PB. Dering the read phase S_read, the level shifter LS keeps Q to be 1.8V or 0V. The gate of the bit line transistor BLT is applied 0.9V and the base of the bit line transistor BLT is applied 0V. Due to the signal clamping, the bit line transistor BLT outputs the data signal d1 as 0.2V while Q is 1.8V, and the bit line transistor BLT outputs the data signal d1 as 0V while Q is 0V. The gate of the memory cell MEM is applied 4V through the word line WL. The gate of the source line transistor SLT is applied 3.3V and the base of the source line transistor SLT is applied 0V. The currents I1 passing through those memory cells MEM will reflected by the data signals d1.

Figure 10C:
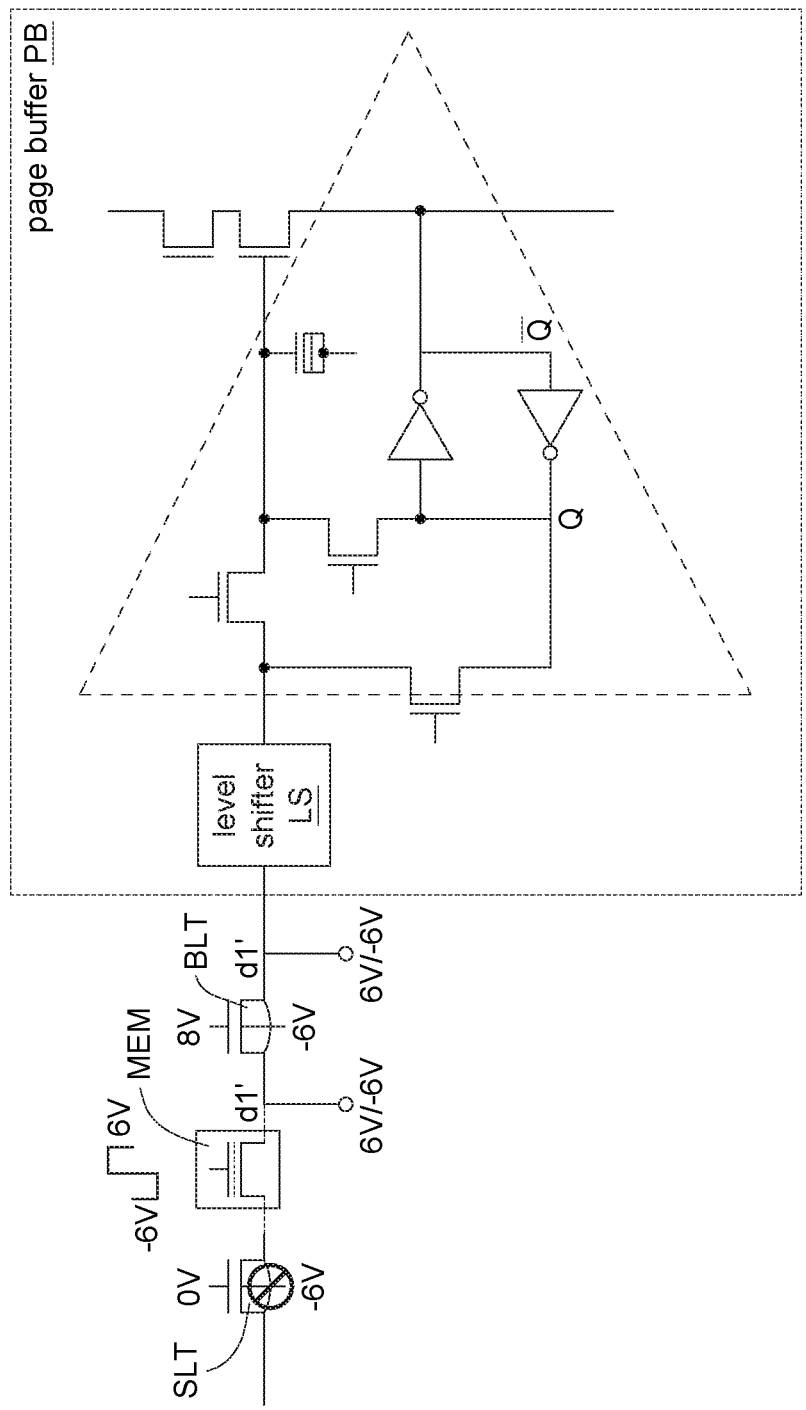
FIG. 10C illustrates the update phase of the page buffer in case of the winner.

Please refer to FIG. 10C, which illustrates the update phase S_update of the page buffer PB in case of the winner. In the update phase S_update, the level shifter LS outputs the shifted data signal d1'. Each of the shifted data signals d1' is the shifted pattern signal or the shifted background signal. The shifted pattern signal is the 6V signal which is shifted with respect to the 0.2V signal. The shifted background signal is the −6V signal which is shifted with respect to the 0V signal. A variety of the shifted data signals d1' is larger than a variety of the data signals d1. The gate of the bit line transistor BLT is applied 8V and the base of the bit line transistor BLT is applied −6V. The memory cells MEM where the shifted pattern signals (6V signals) pass through will be erased, and the memory cells MEM where the shifted background signals (−6V signals) pass through will be programed.

Figure 10D:
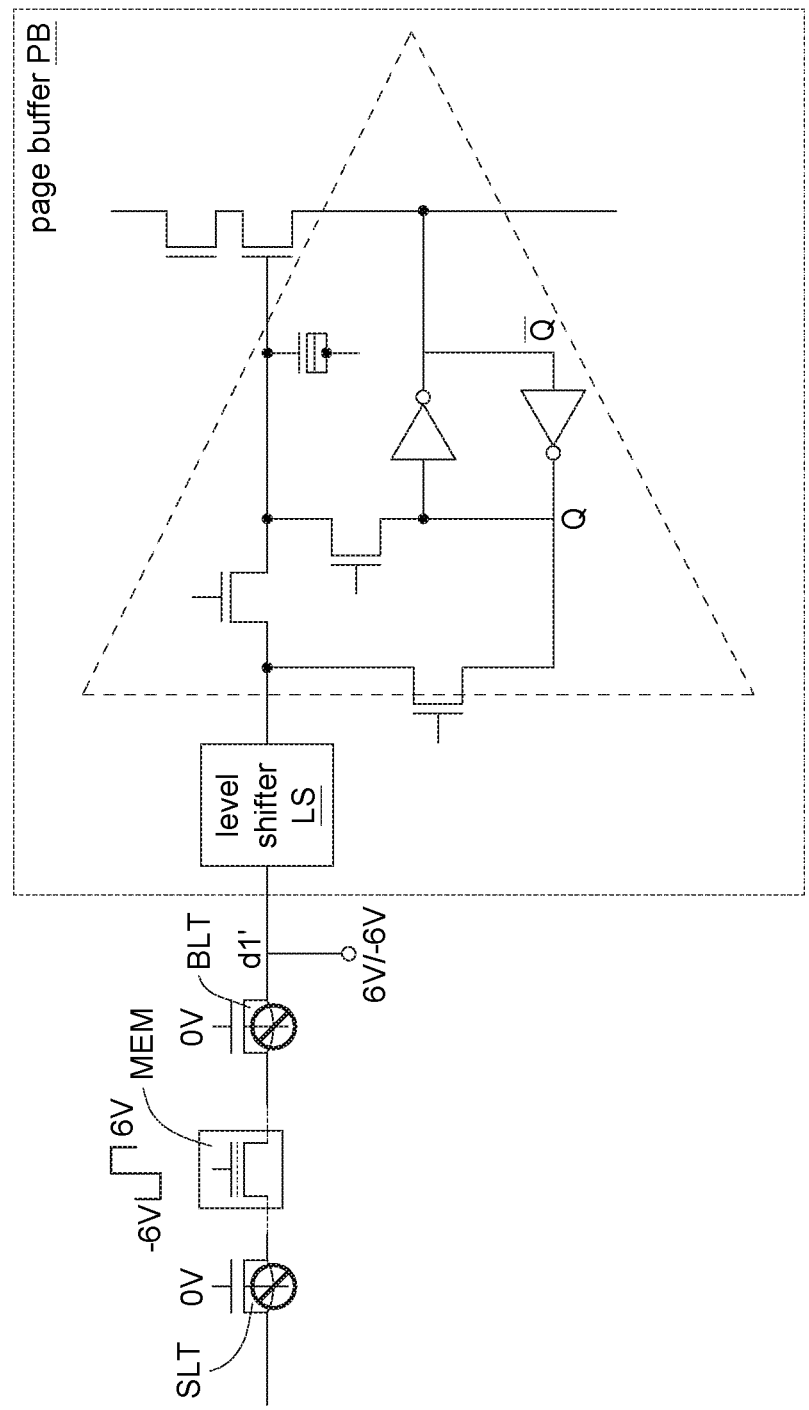
FIG. 10D illustrates the update phase of the page buffer in case of the loser.

Please refer to FIG. 10D, which illustrates the update phase S_update of the page buffer PB in case of the loser. The gates of the bit line transistors BLT are applied 0V to turn off the bit line transistors BLT. Because the bit line transistors BLT are turned off, the bit lines BL are blocked and the memory cells MEM cannot be erased or programed.

According to the embodiments disclosed above, the spiking neural networks circuit 1000 is inputted the data signals d1 through the bit lines BL. The bit-line input scheme not only reduces more energy consumption than word-line input scheme but significantly increases the area efficiency of memory array. Especially, this low power scheme is suitable for edge computing.

For example, in an experiment for comparing the energy consumptions of the spiking neural networks circuits with word-line input scheme and the bit-line input scheme are summarized in the following table I in terms of energy per frame. Base on a measurement, the capacitance of the bit line is 0.075 pF and the capacitance of the word line is 1.882 pF (the capacitance of the bit line is less than the capacitance of the word line). The power consumption of the spiking neural networks circuits with the bit-line input scheme can be reduced 91% for the read phase and reduced 56% for the update phase.

TABLE I

| Architecture | Bits | Read Phase (Inference) (1/frame) | Update Phase (Training) (1/frame) |
| --- | --- | --- | --- |
| SNN circuit with word-line input scheme | Analog | 0.57 nJ | 2.59 nJ |
| SNN circuit with bit-line input scheme | Analog | 0.05 nJ (reduce 91%) | 1.13 nJ (reduce 56%) |

What is claimed is:

1. A spiking neural networks (SNN) circuit, comprising:
a bit-line input synapse array, including:
   a plurality of page buffers, providing a plurality of data signals;
   a plurality of bit line transistors, each of which is electrically connected to one of the page buffers;
   a plurality of bit lines, each of which is electrically connected to one of the bit line transistor for receiving one of the data signals;
   a plurality of memory cells, each of which is electrically connected to one of the bit lines;
   one word line, electrically connected to the memory cells;
   a plurality of source lines, each of which is electrically connected to one of the memory cells; and
   a plurality of source line transistors, each of which is electrically connected to one of the source lines, wherein the source line transistors are connected together; and
a neuron circuit, for outputting a feedback pulse;
wherein one of the bit line transistors, one of the memory cells and one of the source line transistors are connected in series, and the bit line transistors and the bit lines form a presynaptic zone.

2. The spiking neural networks circuit according to claim 1, wherein the bit line transistors and the bit lines form a presynaptic zone, the memory cells and the word line form a synaptic zone, and the source line transistors and the source lines form a postsynaptic zone.

3. The spiking neural networks circuit according to claim 1, wherein the memory cells storing a plurality of weights are connected to the only one word line.

4. The spiking neural networks circuit according to claim 1, wherein the bit line transistors are triple well devices.

5. The spiking neural networks circuit according to claim 1, wherein the source line transistors are triple well devices.

6. The spiking neural networks circuit according to claim 1, wherein the neuron circuit includes:
   a current mirror circuit, electrically connected to the bit-line input synapse array;
   a membrane capacitor, electrically connected to the current mirror circuit;
   an integrated-and-fired circuit, electrically connected to the membrane capacitor; and
   a pulse generator, electrically connected to the integrated-and-fired circuit and the bit line transistors, wherein the integrated-and-fired circuit triggers the pulse generator to generate the feedback pulse or an output pulse when a potential of the membrane capacitor exceeds a threshold.

7. The spiking neural networks circuit according to claim 6, wherein the feedback pulse is used to turn on the bit line transistors.

8. The spiking neural networks circuit according to claim 6, wherein the neuron circuit further includes:
   an inhibitory field-effect transistor (FET), connected to the membrane capacitor, wherein the inhibitory field-effect transistor suppresses an firing action of another neuron circuit when the potential of the membrane capacitor exceeds the threshold.

9. The spiking neural networks circuit according to claim 6, wherein the pulse generator is connected to the source line transistors.

10. The spiking neural networks circuit according to claim 6, wherein the current mirror circuit includes:
    a first current mirror, including two N type Metal-Oxide-Semiconductor (NMOS) transistors; and
    a second current mirror, connected to the first current mirror, wherein the second current mirror includes two P type Metal-Oxide-Semiconductor (PMOS) transistors.

11. The neuron circuit of the spiking neural networks circuit according to claim 10, wherein the NMOS transistors are triple well devices.

12. The spiking neural networks circuit according to claim 1, wherein each of the page buffers includes:
    a level shifter for outputting a plurality of shifted data signals, wherein a variety of the shifted data signals is larger than a variety of the data signal.

13. An operation method of a spiking neural networks (SNN) circuit, wherein the spiking neural networks circuit comprises a bit-line input synapse array and a neuron circuit, the bit-line input synapse array includes a plurality of bit lines, a plurality of memory cells, one word line and a plurality of source lines, each of the memory cells is electrically connected to one of the bit lines, the word line is electrically connected to the memory cells, each of the source lines is electrically connected to one of the memory cells, one of the bit line transistors, one of the memory cells and one of the source line transistors are connected in series, and the bit line transistors and the bit lines form a presynaptic zone, and the operation method comprises:

inputting a plurality of data signals to the bit lines during a read phase; and collecting, by the source lines, currents reflecting the data signals during the read phase.

14. The operation method according to claim 13, wherein each of the data signals is a 0V signal or a 0.2V signal.

15. The operation method according to claim 13, wherein during the read phase, a plurality of bit line transistors, each of which is connected to one of the bit lines, are turned on, and a plurality of source line transistor, each of which is connected to one of the source lines, are tuned on.

16. The operation method according to claim 13, wherein if the neuron circuit is a winner, the operation method further comprises:

inputting a plurality of shifted data signals to the bit lines during an update phase, wherein the shifted data signals are obtained by a level shifter and a variety of the shifted data signals is larger than a variety of the data signal;

applying a long-term potentiation signal to the word line during an erasing step of the update phase, such that an erasing pulse is formed between the word line and the bit lines; and applying a long-term depression signal to the word line during a programming step of the update phase, such that a programming pulse is formed between the word line and the bit lines.

17. The operation method according to claim 16, wherein each of the shifted data signals is −6V signal or a 6V signal, the long-term potentiation signal is a −6V signal, the erasing pulse is a −12V signal, the long-term depression signal is a 6V signal, and the programming pulse is a 12V signal.

18. The operation method according to claim 16, wherein during the update phase, if the neuron circuit is the winner, a plurality of bit line transistors, each of which is connected to one of the bit lines, are turned on, and a plurality of source line transistors, each of which is connected to one of the source lines, are turned off.

19. The operation method according to claim 18, wherein during the update phase, if the neuron circuit is a loser, the bit line transistors and the source line transistors are turned off.

20. The operation method according to claim 13, wherein the memory cells storing a plurality of weights are connected to the only one word line.

* * * * *